United States Patent [19]

Matsumoto

[11] Patent Number: 5,519,351
[45] Date of Patent: May 21, 1996

[54] METHOD FOR ARRANGING TREE-TYPE CLOCK SIGNAL DISTRIBUTING CIRCUIT WITH SMALL CLOCK SKEW

[75] Inventor: Hiroshi Matsumoto, Tokyo, Japan

[73] Assignee: NEC Corporation, Tokyo, Japan

[21] Appl. No.: 338,774

[22] Filed: Nov. 10, 1994

[30] Foreign Application Priority Data

Nov. 10, 1993 [JP] Japan .................................... 5-280996

[51] Int. Cl.$^6$ .................................................... H03K 1/04
[52] U.S. Cl. ........................... 327/295; 327/293; 364/491; 364/489; 395/550
[58] Field of Search ..................................... 327/291, 293, 327/294, 295, 296, 297, 298, 299; 364/488, 489, 490, 491; 395/550

[56] References Cited

U.S. PATENT DOCUMENTS

| 4,812,684 | 3/1978 | Yamagiwa et al. | 327/297 |
| 5,293,626 | 3/1994 | Priest et al. | 395/440 |
| 5,293,627 | 8/1994 | Kato et al. | 395/550 |
| 5,361,277 | 11/1994 | Grover | 327/144 |
| 5,410,491 | 4/1995 | Minami | 364/491 |

FOREIGN PATENT DOCUMENTS

| 2-62675 | 3/1990 | Japan . |
| 2-93917 | 4/1990 | Japan . |
| 2-134919 | 5/1990 | Japan . |

OTHER PUBLICATIONS

Kimoto et al., "Open CAD Clock Tree Synthesis", NEC Technicasl Bulletin, vo. 45, No. 8, (192), p. 16–20.

Primary Examiner—Timothy P. Callahan
Assistant Examiner—Kenneth B. Wells
Attorney, Agent, or Firm—Foley & Lardner

[57] ABSTRACT

In a synchronous integrated circuit including a plurality of functional blocks, the plurality of functional blocks are divided into a plurality of segments. Each of the segments is further divided into classes whose number is dependent upon the density of the functional blocks within each of the segments. A distribution of the functional blocks allocated to one class is homogeneous within the segment to which the class belongs, and one clock buffer is allocated at a substantial center position of the functional blocks within the class.

11 Claims, 11 Drawing Sheets

B ----- CLOCK BUFFER
FF ---- FLIP-FLOP
C1, C2 --- CONNECTION

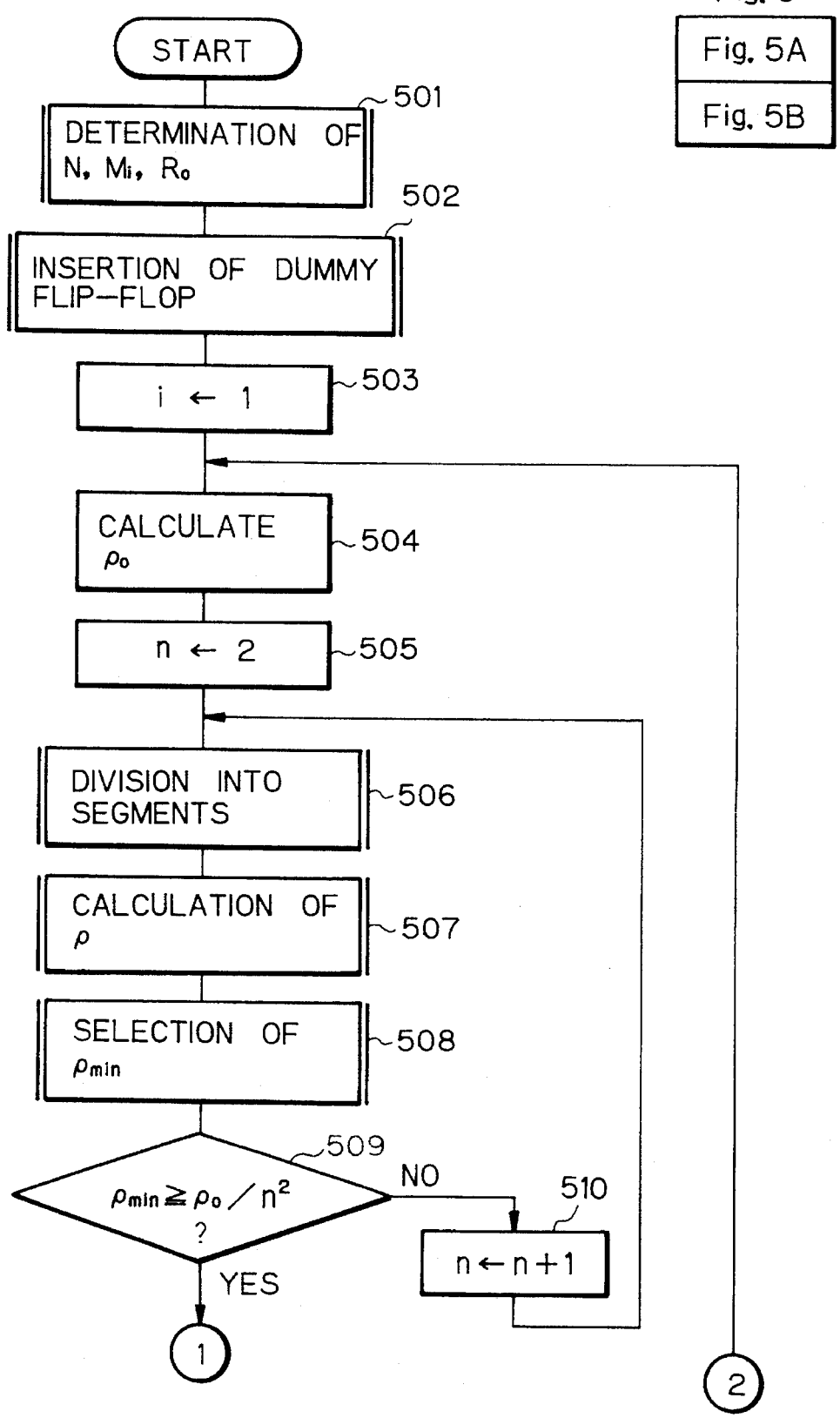

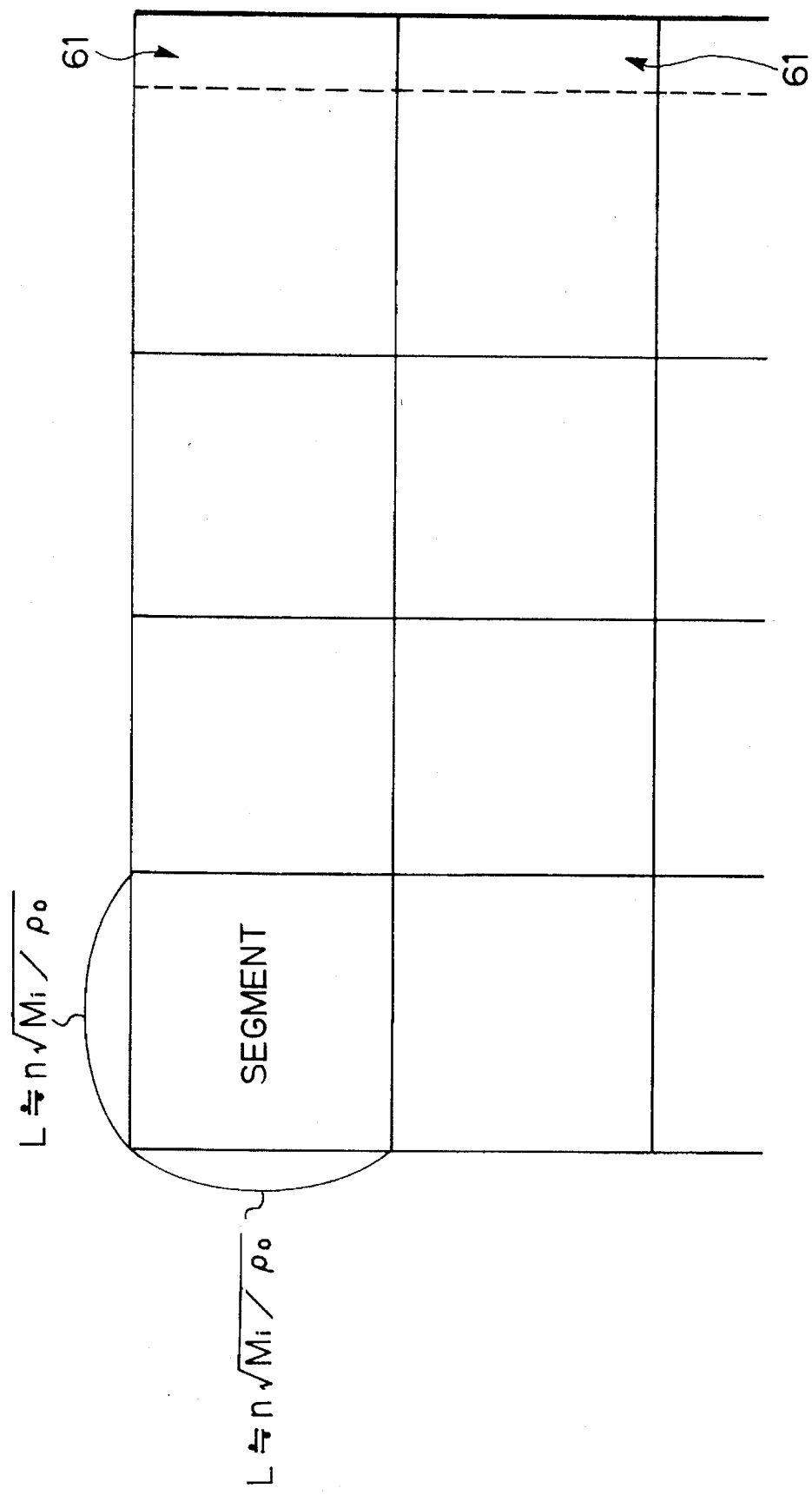

B, B1, B2, B3, -- CLOCK BUFFER
FF ----- FLIP-FLOP
C1, C2 ---- CONNECTION

METHOD FOR ARRANGING TREE-TYPE CLOCK SIGNAL DISTRIBUTING CIRCUIT WITH SMALL CLOCK SKEW

BACKGROUND OF THE INVENTION

1. Field of the Invention

The present invention relates to a method for arranging a tree-type clock signal distributing circuit in a synchronous integrated circuit.

2. Description of the Related Art

Recently, as the speed of integrated circuits has been increased, a timing margin between functional blocks such as flip-flops within the integrated circuits has become critical. In order to avoid a critical condition regarding a time margin, a clock signal is introduced into an integrated circuit, so that all of the functional blocks can be almost simultaneously operated, thus realizing a so-called synchronous integrated circuit.

Even in such a synchronous integrated circuit, when the integration is very advanced, the structure becomes very fine, and the chip area is enlarged, so the resistance of connections for transmitting the clock signal and the capacitance of input nodes of the functional blocks for the clock signal have been both increased. As a result, the delay of the clock signal to the functional blocks fluctuates in accordance with the length of the connection and the number of fan-outs, to thereby increase the clock skew. This is an obstacle in increasing of the frequency of the clock signal.

In the prior art, the fluctuation of delay due to the length of the connections for the clock signal has been compensated for by making the connection configuration for the clock signal a special geometrical or logical configuration.

According to a first prior art method for arranging a clock signal distributing circuit in a synchronous integrated circuit, a main wide connection having a small resistance is arranged at a center of the integrated circuit, and a number of side branch connections are arranged between the main wide connection and the functional blocks, thus realizing a fish back bone shaped configuration for a clock signal distributing circuit. In the fist prior art method, however, the side branch connections are actually slim. Therefore, in order to sufficiently suppress the fluctuation of delay of the clock signal to the functional blocks, the main wide connection should be made as wide as possible, thereby increasing the chip area. Thus, the first prior art method does not contribute to the integration and the high frequency of the clock signal.

A second prior art method for arranging a clock signal distributing circuit in a synchronous integrated circuit uses a geometrical tree synthesis method, i.e., a geometrical tree-type clock signal distributing circuit where clock buffers are determined from an upstream side of the clock signal to a downstream side thereof (see JP-A-HEI2 -62675, JP-A-HEI2-93917 and JP-A-HEI2-134919). This will be explained later in detail.

In the second prior art method, however, since the functional blocks are not always arranged in regular positions, the functional blocks are not always arranged near clock buffers, thereby increasing the clock skew. Also, if the functional blocks are forcibly adapted to the clock buffers, logic gate combination circuits connected to the functional blocks are not suitably arranged. Further, when the distribution of the functional blocks is not homogeneous, the result is a lot of unused clock buffers and a lot of clock buffers having a small number of fan-outs, such as a single fan-out, thereby increasing the chip area, thus reducing the integration.

A third prior art method for arranging a clock signal distributing circuit in a synchronous integrated circuit uses a logical tree synthesis method, i.e., a logical tree-type clock signal distributing circuit where clock buffers are determined from a downstream side of the clock signal to an upstream side thereof (see T. Kimoto et al., "OpenCAD Clock Tree Synthesis", NEC Technical Bulletin, Vol. 45, No. 8, pp. 16–20, 1992). That is, the functional blocks are divided into classes each having the same number of functional blocks which are located in the same neighborhood. Then, one clock buffer is arranged at a substantial center position of each of the classes, and the clock buffer is connected to the functional blocks thereof. Thereafter, the above-mentioned steps are repeated by replacing the functional blocks with the clock buffers, until the number of the clock buffers is reduced to one. Thus, the fan-outs of each clock buffer can be balanced to suppress the increase of the clock skew. This will be explained later in detail.

In the third prior art method, however, if the density of functional blocks is not homogeneous within the integrated circuit, the length of connections to the clock buffers fluctuates, so that the clock skew is increased.

SUMMARY OF THE INVENTION

It is an object of the present invention to provide a method for arranging a tree-type clock signal distributing circuit in a synchronous integrated circuit which can reduce the clock skew due to the fluctuation of length of connections even when the density of functional blocks is not homogeneous.

According to the present invention, in a synchronous integrated circuit including a plurality of functional blocks, the plurality of functional blocks are divided into a plurality of segments. Each of the segments is further divided into classes whose number is dependent upon the density of the functional blocks within each of the segments. A distribution of the functional blocks allocated to one class is homogeneous within the segment to which the class belongs, and one clock buffer is allocated at a substantial center position of the functional blocks within the class.

BRIEF DESCRIPTION OF THE DRAWINGS

The present invention will be more clearly understood from the description as set forth below, as compared with the prior art, with reference to the accompanying drawings, wherein:

FIG. 5 is a block diagram illustrating a combination of FIGS. 5A and 5B;

FIGS. 5A and 5B are flowcharts showing the operation of the control circuit of FIG. 4;

FIG. 6 is a diagram illustrating example of the segments used in the routine of FIG. 5;

DESCRIPTION OF THE PREFERRED EMBODIMENTS

Before the description of the preferred embodiment, a prior art method for arranging a tree-type clock signal distributing circuit will be explained with reference to FIGS. 1, 2 and 3A–3C.

Figure 1:
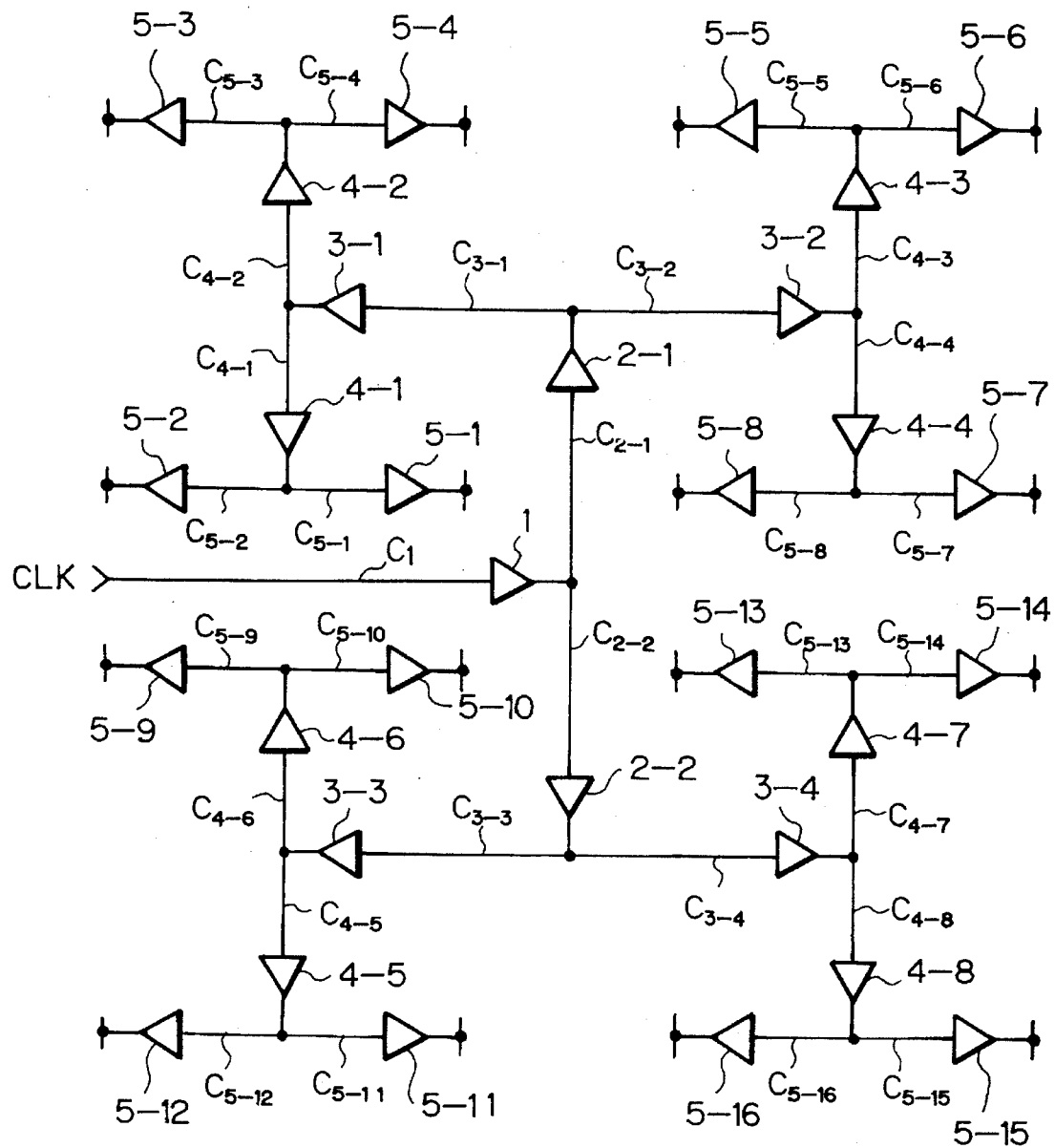
FIG. 1 is a diagram illustrating a prior art geometrical tree-type clock signal distributing circuit.

In FIG. 1, which illustrates a tree-type clock signal distributing circuit for explaining a geometrical tree synthesis method, clock buffers are arranged from an upstream side of a clock signal to a downstream side thereof (see JP-A-HEI2-62675, JP-A-HEI2-93917 and JP-A-HEI2-134919). In FIG. 1, the fan-out of each clock buffer is 2, to simplify the description. That is, a clock signal CLK is fed via a horizontal connection $C_1$, to an input of a 1st level clock buffer 1. The clock buffer 1 has two outputs, i.e., two vertical connections $C_{2-1}$ and $C_{2-2}$ which are connected to 2nd level clock buffers 2-1 and 2-2, respectively. In this case, the length of each of the connections $C_{2-1}$ and $C_{2-2}$ to the connection $C_1$ is definite. Similarly, each of the clock buffers 2-1 and 2-2 has two outputs, i.e., two horizontal connections, such as $C_{3-1}$ and $C_{3-2}$, which are connected to 3nd level clock buffers 3-1 and 3-2, respectively. In this case, the length of each of the connections $C_{3-1}$ and $C_{3-2}$ to the connections $C_{2-1}$ and $C_{2-2}$ is definite. This method is repeated to obtain a five-storied hierarchic fractal-like configuration which is geometrically fixed. Then, each of the final level clock buffers 5-1 through 5-16 is connected to a number of functional blocks such as two flip-flops (not shown) located in the neighborhood thereof.

In FIG. 1, however, as stated above, since the flip-flops are not always arranged in regular positions, the flip-flops are not always arranged near the final level clock buffers 5-1 through 5-16, thereby increasing the clock skew. Also, if the flip-flops are forcibly adapted to the final level clock buffers 5-1 through 5-16, logic gate combination circuits connected to the flip-flops are not suitably arranged. Also, when the distribution of the flip-flops is not homogeneous, the result is a lot of unused final level clock buffers and a lot of final level clock buffers having a small number of fan-outs such as a single fan-out, thereby increasing the chip area, thus reducing the integration.

Figure 2:
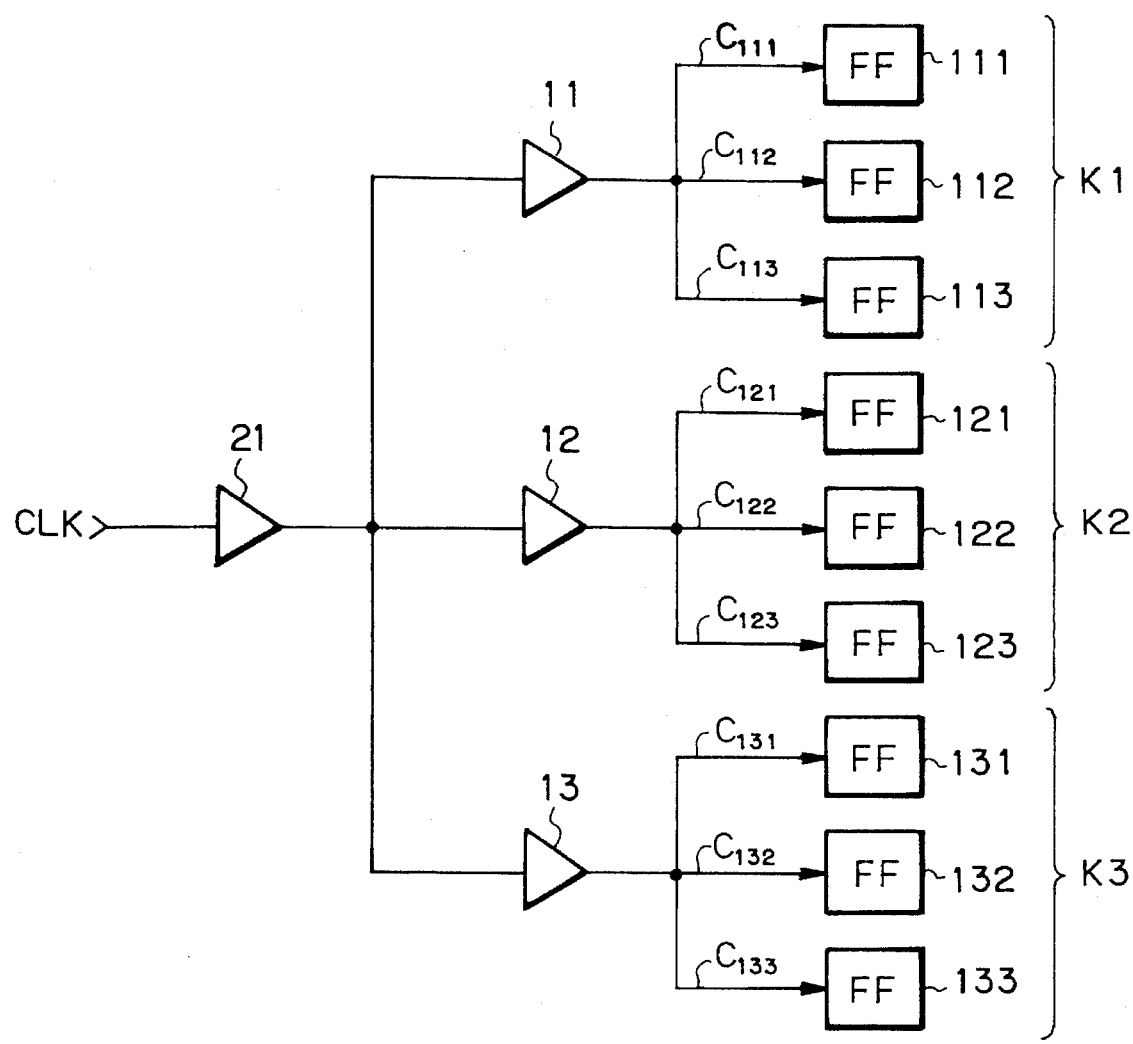
FIG. 2 is a diagram illustrating a prior art logical tree-type clock signal distributing circuit.

In FIG. 2, which illustrates a tree-type clock signal distributing circuit for explaining a logical tree synthesis method, clock buffers are arranged from a downstream side of a clock signal to an upstream side thereof (see T. Kimoto et al., "OpenCAD clock Tree Synthesis", NEC Technical Bulletin, Vol. 45 No. 8, pp. 16–20, 1992). That is, flip-flops are divided into classes. For example, flip-flops 111 to 113 are allocated to a class K1; flip-flops 121 to 123 are allocated to a class K2; and flip-flops 131 to 133 are allocated to a class K3. In this case, the flip-flops allocated to each class are in the neighborhood of each other. Also, the number of flip-flops allocated to each class is the same, in this case, 3. Then, one final level clock buffer such as 11 is arranged at a substantial center position of each of the classes, and this clock buffer is connected by connections such as $C_{111}$, $C_{112}$ and $C_{113}$ to the flip-flops 111, 112 and 113. Thereafter, the above-mentioned steps are repeated to obtain a two-storied hierachic configuration which is, however, not geometrically fixed. Thus, fan-outs of each clock buffer can be balanced to suppress the increase of the clock skew.

Figure 3B:
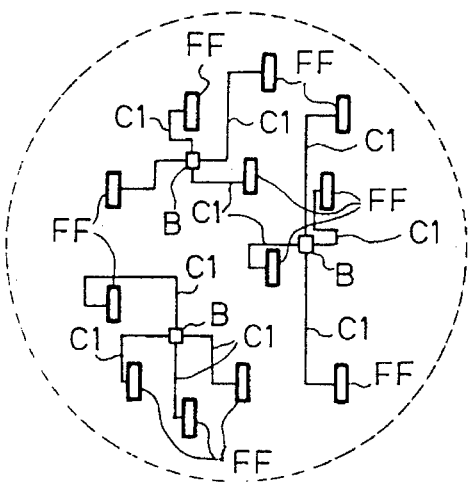
FIGS. 3A–3C are diagrams of an actual example of the clock signal distributing circuit of FIG. 2.
Figure 3C:
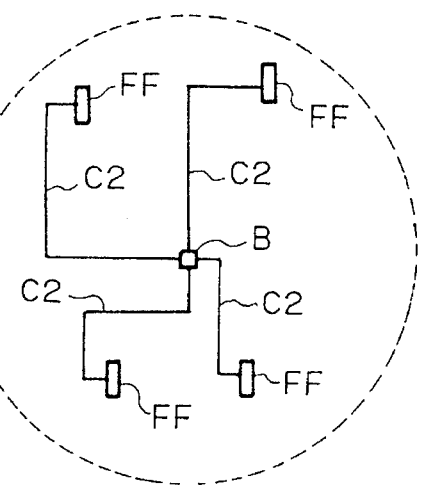
Figure 3A:
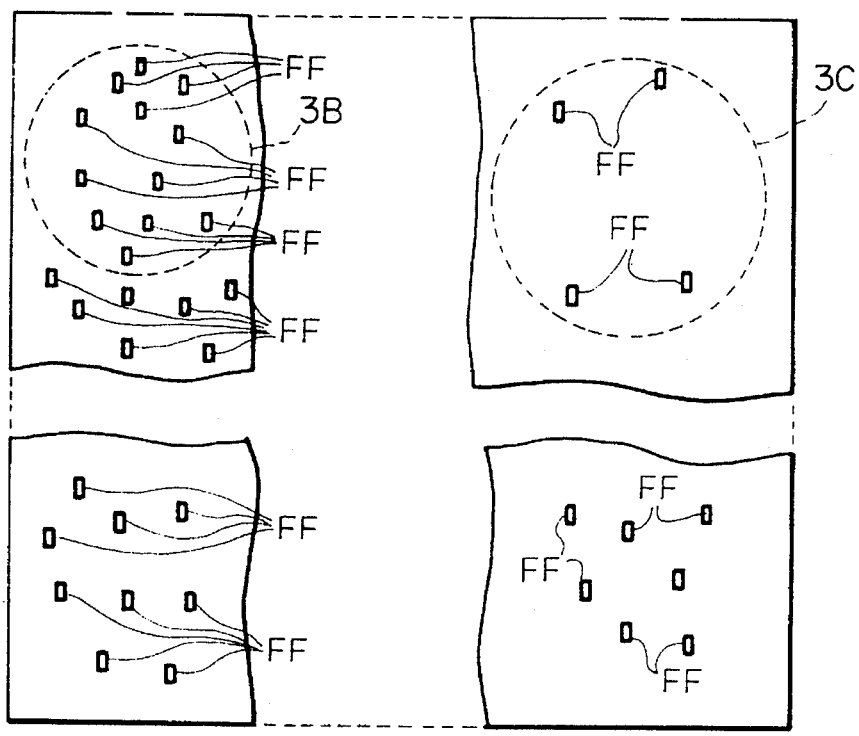

In FIG. 2, however, if the density of flip-flops is not homogeneous with the integrated circuit, the length of connections to the clock buffers fluctuates, so that the clock skew is increased. For example, as illustrated in FIGS. 3A–3C, in a region 3B where the density of flip-flops FF is relatively large, connections C1 between clock buffers B and flip-flops FF are short, while in a region 3C where the density of flip-flops FF is relatively small, connections C2 between clock buffers B and flip-flops FF are long. Generally, the length of each connection is approximately in proportion to the square root of the density of flip-flops. Therefore, since the length of connections between the clock buffers and the flip-flops fluctuates in accordance with the density of flip-flops, the clock skew is increased.

Figure 4:
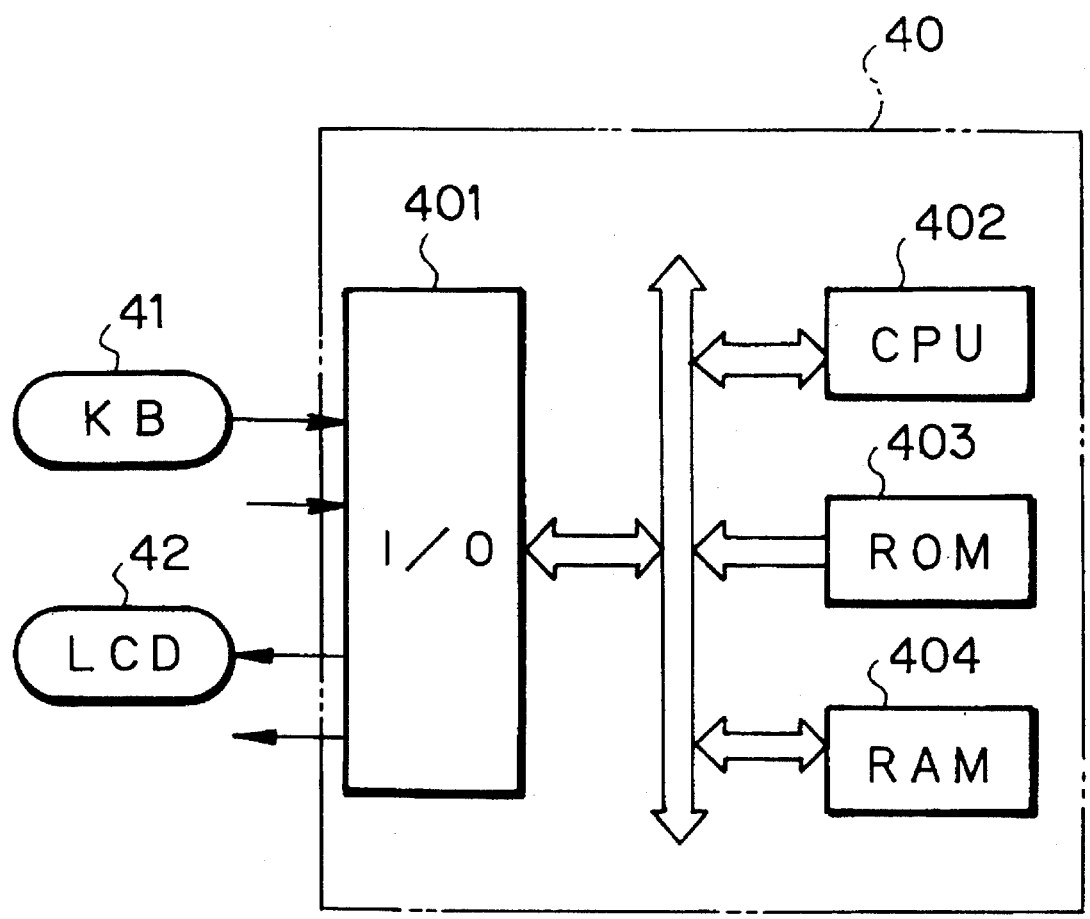
FIG. 4 is a block circuit illustrating an apparatus for carrying out an embodiment of the method for arranging a tree-type clock signal distributing circuit according to the present invention.

In FIG. 4, which illustrates an apparatus 40 for carrying out an embodiment of the method for arranging a tree-type clock signal distributing circuit according to the present invention, the apparatus 40 is constructed by a computer which includes an input/output (I/O) interface 401, a central processing unit (CPU) 402, a read-only memory (ROM) 403 for storing programs and fixed data, a random access memory (RAM) 404 for storing temporary data, and the like. The I/O interface 401 receives various input signals from the keyboard 41 and the like, and generates various signals and transmits them to a display such as a liquid crystal display (LCD) 42 and the like.

The operation of the apparatus 40 of FIG. 4 will be explained with reference to FIGS. 5, 5A, 5B, 6, 7, 8, 9 and 10. Here, the present invention is applied to a 200 K gate standard cell base integrated circuit, as an example. Also, an area which requires no clock signal distributing line is omitted from the integrated circuit in advance.

Figure 5B:
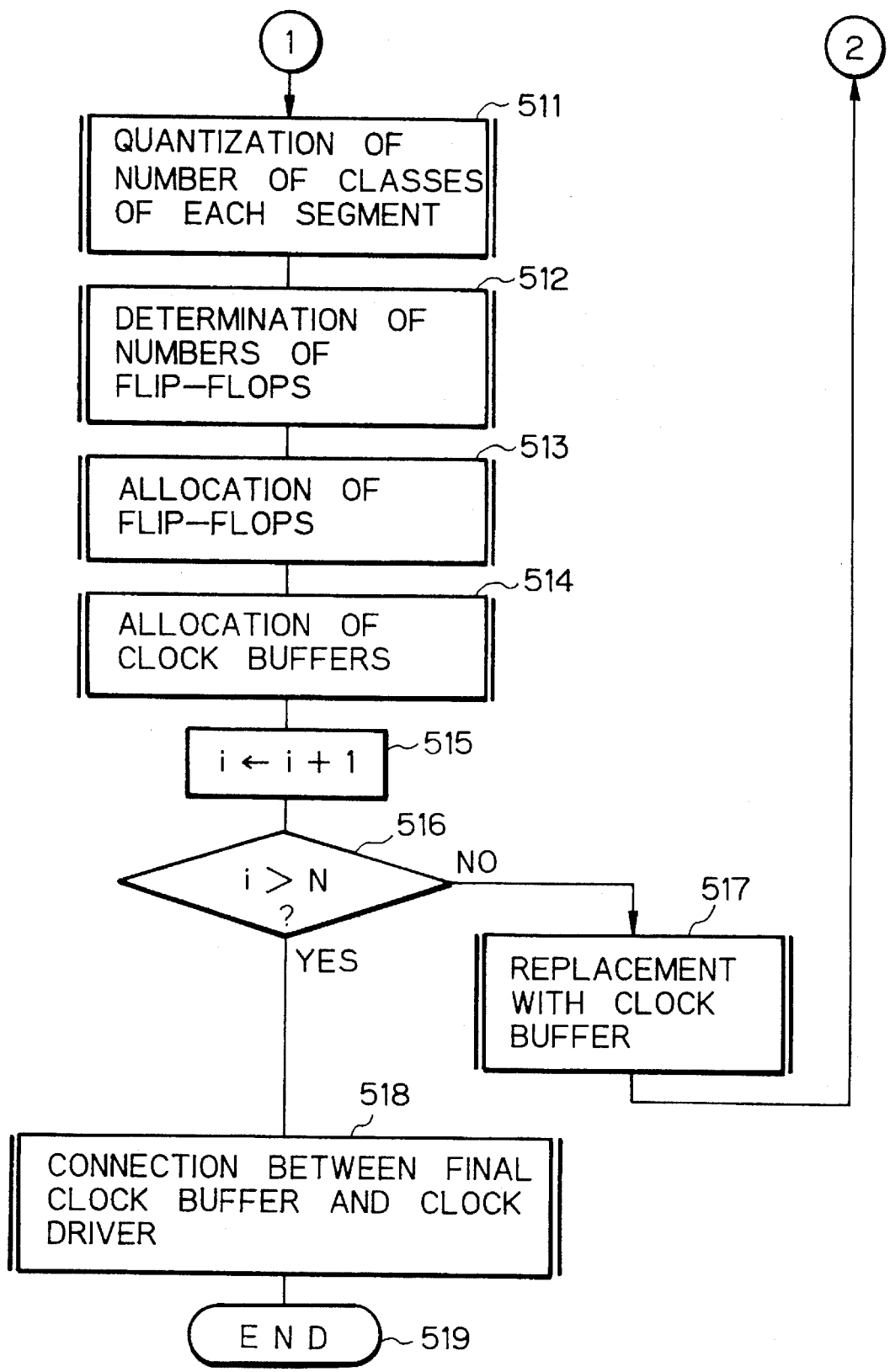

Referring to FIGS. 5A and 5B, which show a main routine, at step 501, the number N of stages of a clock tree, the number Mi of fan-outs of an i-th stage and the number $R_0$ of dummy flip-flops are determined by $$M_1 \times M_2 \times \ldots \times M_N = M_0 R_0$$

$M_0$ is the total number of flip-flops. In this case, these values are determined so that the value N is minimum and the value $R_0$ is minimum. Also, $2 \leq M_i \leq FO_i$ (definite value) and $R_0 \geq 0$. For example, if $M_0 = 32765$, then,

N=5
$M_1 = M_2 = M_3 = M_4 = M_5 = 8$
$R_0 = 3$.

Next, at step 502, the $R_0$ dummy flip-flops are inserted into adequate positions of the integrated circuit.

Next, at step 503, the value i is initialized, i.e., i=1. In this case, a first stage of the clock tree on the downstream side thereof is indicated.

Next, at step 504, an average density $\rho_0$ of flip-flops within the integrated circuit is calculated.

Next, at step 505, a multiplication constant n is initialized, i.e., n=2. This multiplication constant n will be used at step 509.

Next, at step 506, the integrated circuit is divided into a number of square segments each having a length L which is a multiple of a grid length and is closest to $n\sqrt{M_i/\rho_0}$ as shown in FIG. 6. In this case, note that, if there is a segment having a length smaller than L as indicated by arrows 61 in FIG. 6, such a segment is united with its adjacent segment.

If the density of flip-flops within the integrated circuit is completely homogeneous, each segment includes $M_1 \times n^2$ flip-flops. As a result, $n^2$ clock buffers are allocated to each segment. However, actually, the density of flip-flops is not homogeneous.

Next, at step 507, a density $\rho$ of flip-flops within each of the segments is calculated. In this case, the segments having the density of 0 are omitted. Then, at step 508, a minimum value $\rho_{min}$ of the densities $\rho$ is selected.

Next, at step 509, it is determined whether or not $$\rho_{min} \geq \rho_o/n^2$$

As a result, only when $\rho_{min} \geq \rho_o/n^2$, does the control proceed to step 511. Otherwise, the control proceeds to step 510 which increases the multiplication constant n by +1, and then, the control at steps 506 through 509 is repeated.

At step 511, the number p of classes of each segment is quantized in accordance with the minimum value $\rho_{min}$ of the densities $\rho$. This will be explained later in detail with reference to FIG. 7.

Next, at step 512, the number of flip-flops allocated to each of the classes is determined. This will be also explained with reference to FIG. 8.

Next, at step 513, flip-flops are allocated to the classes within each of the segments. In this case, a distribution of the flip-flops allocated to each class is homogeneous within the segment to which this class belongs. For example, the flip-flops within each of the segments are randomly selected and allocated sequentially to the classes thereof.

Next, at step 514, one clock buffer is allocated to each of the classes. In this case, one clock buffer is inserted at a substantial center position, i.e., an arithmetic average position of the flip-flops of each of the classes, and is connected by connections to the flip-flops.

At step 515, the value i is incremented by +1, and at step 516, it is determined whether or not i>N is satisfied. Only when i>N, does the control proceed to step 518. Otherwise, the control proceeds the step 517 which replaces the flip-flops with the clock buffers allocated at step 514, and then return to step 504, thus repeating the above-mentioned steps 504 through 514. In other words, the control at steps 504 through 514 is repeated until the number of allocated clock buffers is one.

At step 518, a final clock buffer which is finally arranged at a substantial center position of all of the flip-flops is connected by a connection to a clock driver (not shown) which receives an external clock signal or an internal clock signal derived from a control circuit (not shown).

Then, this routine of FIGS. 5A and 5B is completed by step 519.

Figure 7:
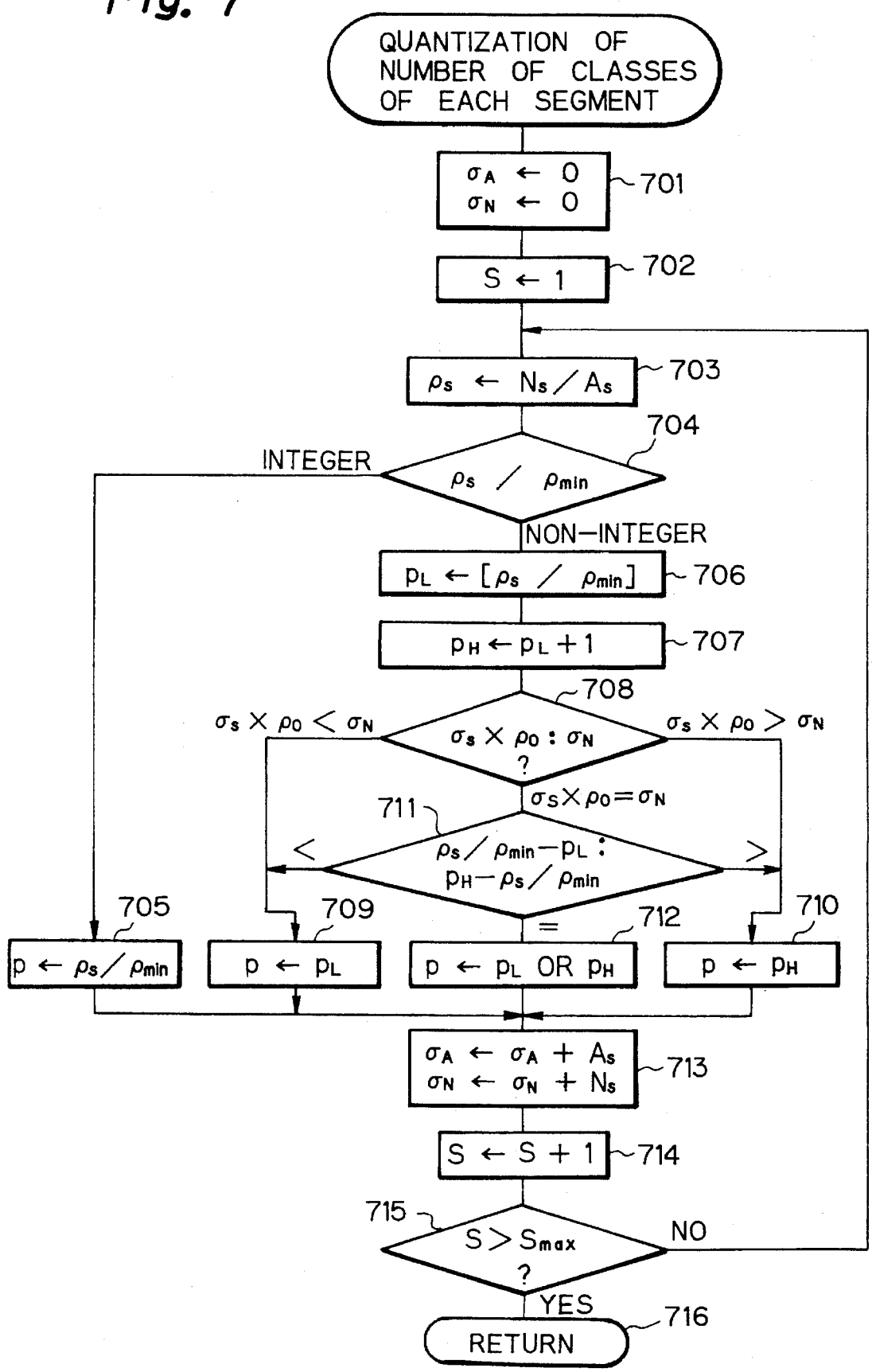
FIG. 7 is a detailed flowchart of the quantization step of FIG. 5.

In FIG. 7, which is a detailed flowchart of step 511 of FIG. 5, at step 701, a segment area variable $\sigma_A$ and an input node number $\sigma_N$ are initialized, i.e., $\sigma_A=0$ and $\sigma_N=0$. In this case, the input node number $\sigma_N$ represents a number of flip-flops.

Next, at step 703, a density of flip-flops for a segment S is calculated by $$\rho_S \leftarrow N_S/A_S$$

where $A_S$ is an area of the segment S; and $N_S$ is the number of flip-flops within the segment S.

Next, at step 604, a value $\rho_S/\rho_{min}$ is calculated, and it is determined whether the value $\rho_S/\rho_{min}$ is an integer. Only when the value $\rho_S/\rho_{min}$ in an integer, does the control proceed to step 705 which causes the number p of classes to be $\rho_S/\rho_{min}$. Otherwise, the control proceeds to step 706.

At step 706, an integer $p_L$ closest to the value $\rho_S/\rho_{min}$ but smaller is calculated, i.e., $$p_L \leftarrow [\rho_S/\rho_{min}]$$

Also, at step 706, an integer $p_H$ closest to the value $\rho_S/\rho_{min}$ but larger is calculated, i.e., $$p_H \leftarrow p_L+1$$

Next, at step 708, a value $\sigma_S \times p_o$ is compared with the input node number $\sigma_N$.

At step 708, a value $\sigma_S \times p_o < \sigma_N$, the control proceeds to step 709 which causes the number p of classes to be $p_L$. Also, when $\sigma_S \times p_o > \sigma_N$, the control proceeds to step 710 which causes the number p of classes to be $p_H$. Further, when $\sigma_S \times p_o = \sigma_N$, the control proceeds to step 711.

At step 711, a value $\rho_S/\rho_{min}-p_L$ is compared with a value $p_H - \rho_S/\rho_{min}$.

At step 711, when $\rho_S/\rho_{min}-p_L < p_H-\rho_S/\rho_{min}$, the control proceeds to step 709 which causes the number p of classes to be $p_L$. Also, when $\rho_S/\rho_{min}-p_L > p_H-\rho_S/\rho_{min}$, the control proceeds to step 710 which causes the number p of classes to be $p_H$. Further, when $\rho_S/\rho_{min}-p=p_H-\rho_S/\rho_{min}$, the control proceeds to step 712.

At step 712, the number p of classes is caused to be $p_L$ or $p_H$. In this case, the selection of $p_L$ and $p_H$ is carried out alternately or randomly.

The control at step 705, 709, 710 and 712 proceeds to step 713 which increments the segment area variable $\sigma_A$ and the input node number $\sigma_N$ by $$\sigma_A \leftarrow \sigma_A = A_S$$

$$\sigma_N \leftarrow \sigma_N = N_S$$

The control at steps 703 through 713 is repeated by steps 714 and 715 for all of the segments. In this case, a value $S_{max}$ represents the number of segments.

Thus, at step 716, the routine of FIG. 7 returns to step 512 of FIG. 5.

That is, in the routine of FIG. 7, the number p of classes within each of the segments is quantized so that the value $\sigma_S/\sigma_N$ is brought close to the average density $\rho_o$.

Figure 8:
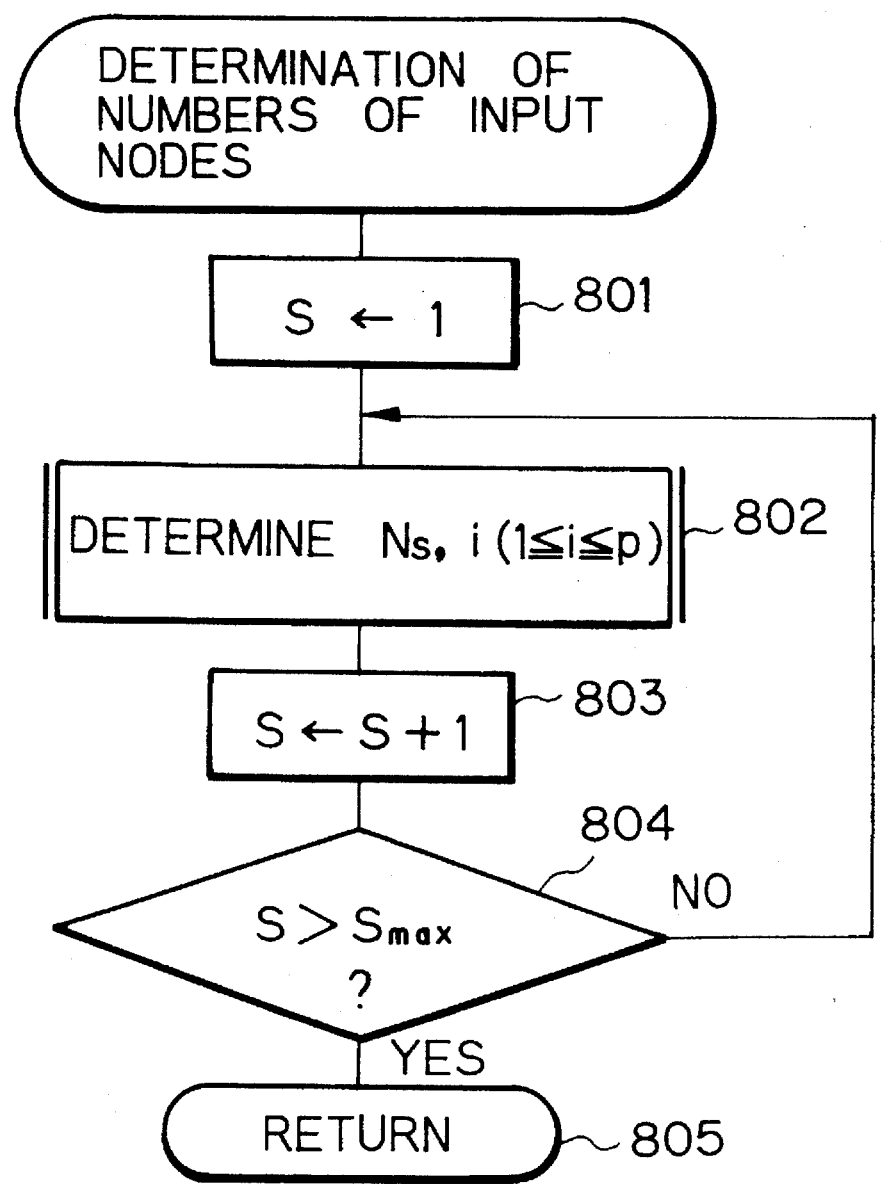
FIG. 8 is a detailed flowchart of the functional block allocating step of FIG. 5.

In FIG. 8, which is a detailed flowchart of step 512 of FIG. 5, at step 801, the segment number S is initialized, i.e., $$S \leftarrow 1$$

At step 802, a number $N_{S,i}$ of flip-flops allocated to a class i of the segment S is calculated. In this case, the number $N_{S,i}$ is determined so that the following value:

$$|\sigma_{S,i}\cdot p_o - \sigma_{N,i}| - |(\sigma_{S,i}+A_S)\cdot p_o-(\sigma_{N,i}+N_{S,i})|$$

is brought close to a minimum value. Also, each value $\sigma_{S,i}$ is a multiple of $M_i$.

The control at step 802 is repeated by steps 803 and 804 for all of the segments.

Then, this routine of FIG. 8 returns to step 513 of FIG. 5.

Figure 9:
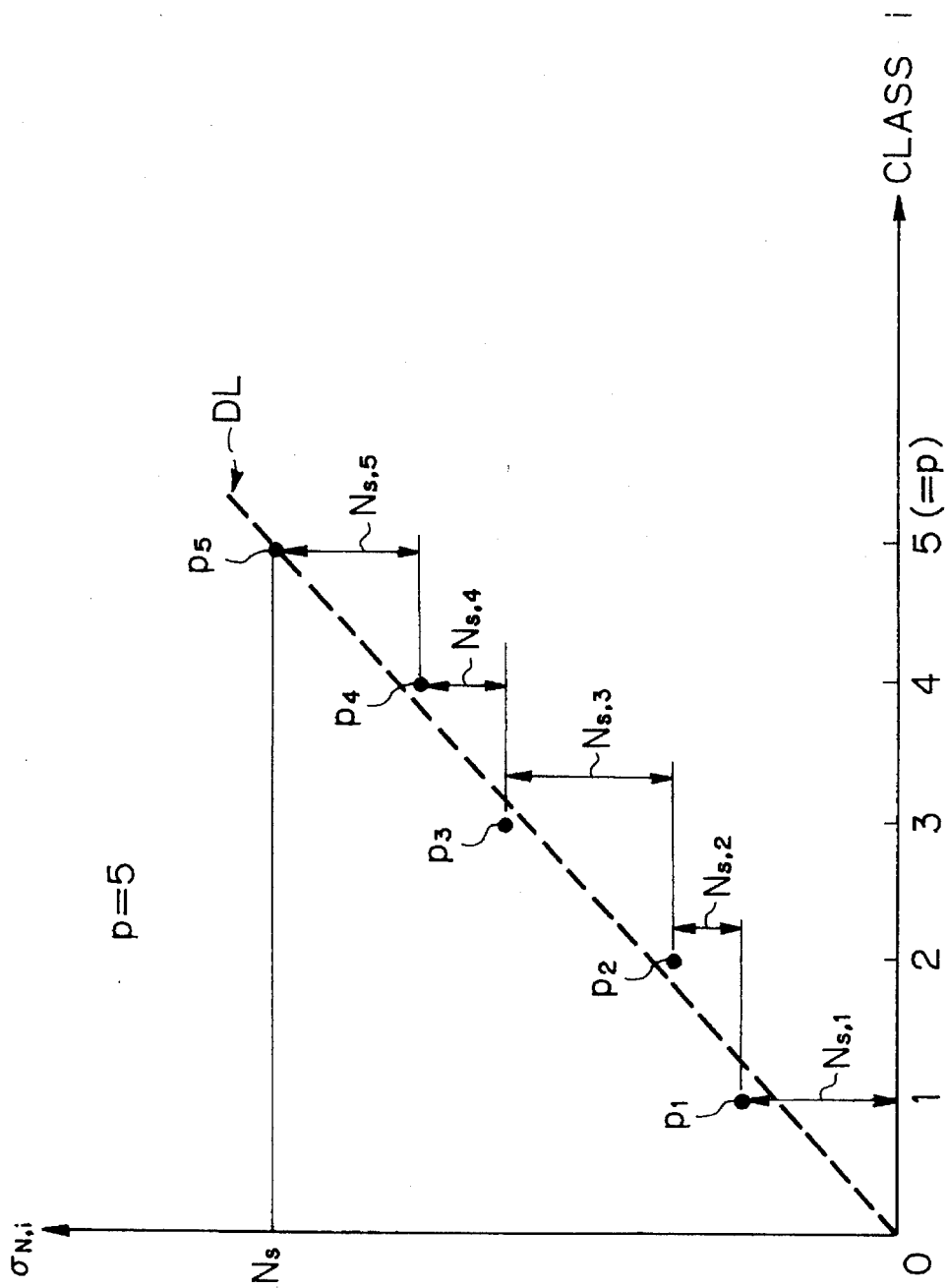
FIG. 9 is a graph showing the operation of the routine of FIG. 8.

Thus, according to the routine of FIG. 8, as shown in FIG. 9, the value $N_{S,i}$ is determined so that a point $p_i$(i=1 to p) is brought close to a dotted line indicated by DL.

Figure 10B:
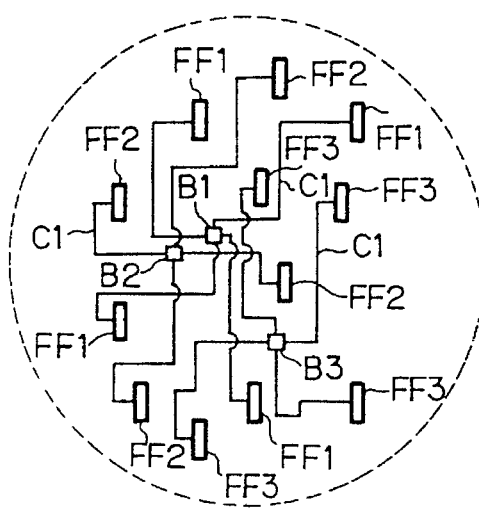
FIGS. 10A–10C are diagrams showing an actual example of the clock signal distributing circuit obtained by the routine of FIG. 5.
Figure 10C:
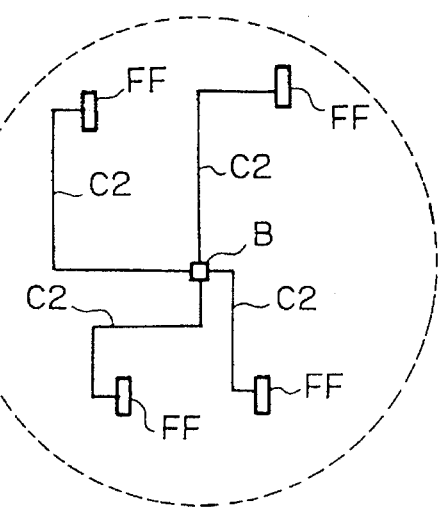
Figure 10A:
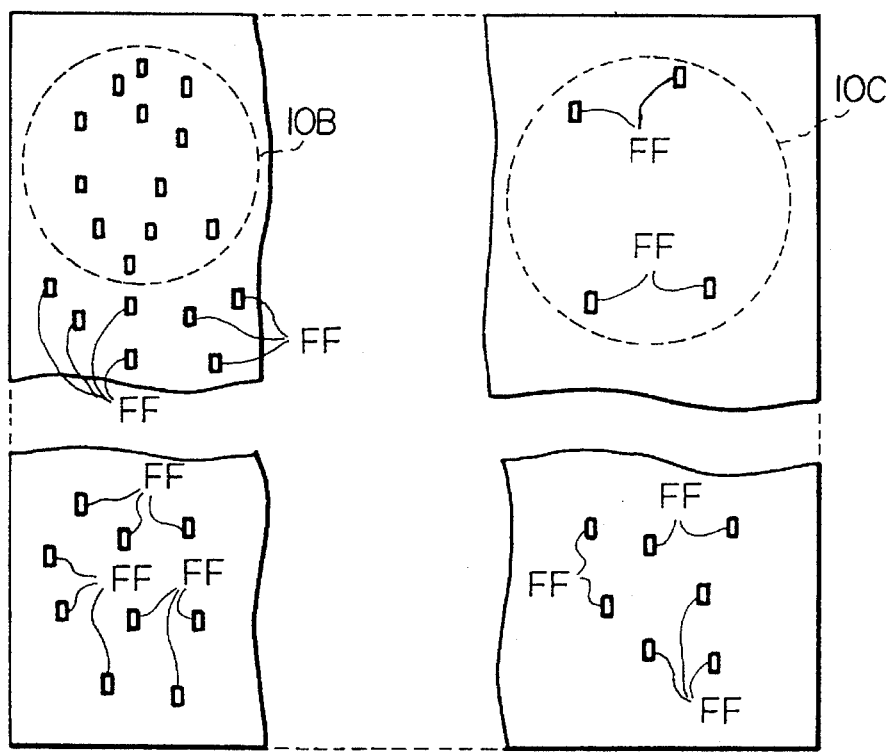

According to the above-described embodiment, the flip-flops (clock buffers) belonging to each of the classes are arranged homogeneously within one segment to which this class belongs. In other words, the density of flip-flops (clock buffers) allocated to each class is close to the minimum value $\rho_{min}$. For example, as illustrated in FIGS. 10A–10C, the length of connections C1 between a clock buffer B1 (B2, B3) and flip-flops FF1 (FF2, FF3) in a region 10B where the density of flip-flops FF is relatively large is about the same as that of connections C2 between clock buffers B and flip-flops FF in a region 10c were the density of flip-flops FF is relatively small. Thus, all of the connections for clock signal to the flip-flops do not fluctuate, i.e., are homogeneous.

As explained hereinbefore, according to the present invention, since all of the connections for a clock signal to functional blocks are homogeneous, the clock skew can be reduced.

I claim:

1. A method for arranging a tree-type clock signal distributing circuit in a synchronous integrated circuit including a plurality of functional blocks, said method being performed by a processor which includes a central processing unit and a memory, said method comprising the steps of:

partitioning, by said central processing unit, said synchronous integrated circuit into a plurality of segments;

calculating, by said central processing unit, a density of said functional blocks within each of said segments and storing said density in said memory;

calculating, by said central processing unit, a minimum value of the stored densities of said functional blocks and storing said minimum value in said memory;

quantizing, by said central processing unit, the densities of functional blocks of said segments in accordance with the stored minimum value, so that said segments are divided into classes whose number is the same as a quantized density of each of said segments, and storing said classes of segments in said memory;

determining, by said central processing unit, the number of functional blocks belonging to each of said stored classes of segments;

allocating, by said central processing unit, said functional blocks within each of said segments to said classes thereof, so that a distribution of said functional blocks allocated to each of said classes is homogeneous within one of said segments to which the same class belongs, and storing said allocated functional blocks to said classes in said memory;

allocating, by said central processing unit, one clock buffer to a substantial center position of said functional blocks allocated to each of said classes, to connect said clock buffer to said functional blocks within each of said classes; and repeating the above-mentioned steps by replacing said functional blocks with said clock buffers, until the number of clock buffers is one.

2. A method as set forth in claim 1, further comprising a step of calculating an average density of said functional blocks within said integrated circuit, said segment dividing step comprising the steps of:

dividing said integrated circuit into a plurality of square areas as said segments, each area having a predetermined length multiplied by a multiplication constant;

calculating a density of said functional blocks within each of said square areas;

calculating a minimum value of the densities of said functional blocks within said square areas;

determining whether or not $\rho_{min} < \rho_o/n^2$ where $\rho_{min}$ is the minimum value of the densities, $\rho_o$ is the average density, and n is the multiplication constant;

increasing the multiplication constant only when $\rho_{min} < \rho_o/n^2$ is satisfied; and repeating said dividing, calculating, determining and increasing steps when the multiplication constant is increased.

3. A method as set forth in claim 2, further comprising a step of determining a clock tree defined by $M_1 \times M_2 \times \ldots \times M_N = M_0 = R_0$ where $M_i$ (i=1, 2, ..., N) is the number of fan-outs of an i-stage, $M_0$ is the number of said functional blocks within said integrated circuit, and $R_0$ is the number of dummy functional blocks;

allocating said dummy functional blocks to said synchronous integrated circuit, the predetermined length of said squares being determined approximately by $n.(M_{i\,\rho_o})1/2$, when the i-stage of said clock tree is calculated.

4. A method as set forth in claim 3, wherein said clock tree determining step calculates the number $M_i$ (i=1, 2, ..., N) of fan-outs, so that the number N of stages is minimum and the number of said dummy functional blocks is minimum.

5. A method as set forth in claim 3, wherein said function block number determining step determines the number of said functional blocks of each of said classes in accordance with a multiple of $M_i$ when the i-stage of said clock tree is calculated.

6. A method as et forth in claim 1, wherein said functional block allocating step allocates said functional blocks within each of said segments randomly to said classes thereof.

7. A method for arranging a tree-type clock signal distributing circuit in a synchronous integrated circuit including a plurality of functional blocks, said method being performed by a processor which includes a central processing unit and a memory, said method comprising the steps of:

determining, by said central processing unit, a clock tree defined by $M_1 \times M_2 \times \ldots \times M_N = M_0 + R_0$ where $M_i$ (i=1, 2, ..., N) is the number of fan-outs of an i-stage, $M_0$ is the number of said functional blocks within said integrated circuit, and $R_0$ is the number of dummy functional blocks;

allocating, by said central processing unit, said dummy functional blocks to said synchronous integrated circuit;

calculating, by said central processing unit, an average density $\rho_o$ of said functional blocks within said synchronous integrated circuit;

partitioning, by said central processing unit, said integrated circuit into a plurality of square segments, each having a length determined by $n.(M_{i\,\rho_o})^{1/2}$ where n is an integer larger than 1, when the i-stage of said clock tree is calculated;

calculating, by said central processing unit, a density of said functional blocks within each of said segments;

calculating, by said central processing unit, a minimum value of the densities of said functional blocks;

quantizing, by said central processing unit, the densities of functional blocks of said segments in accordance with the minimum value, so that said segments are divided into classes whose number is the same as a quantized density of each of said segments;

determining, by said central processing unit, the number of functional blocks belonging to each of said classes;

allocating, by said central processing unit, said functional blocks within each of said segments of said classes thereof, so that a distribution of said functional blocks allocated to each of said classes in homogeneous within one of said segments to which the same class belongs;

allocating, by said central processing unit, one clock buffer to a substantial center position of said functional blocks allocated to each of said classes, to connect said clock buffer to said functional blocks within each of said classes; and repeating said average density calculating step through said clock buffer allocating step by replacing said functional blocks with said clock buffer, until the number of said clock buffers is one.

8. A method as set forth in claim 7, wherein said clock tree determining step calculates the number $M_i$ ($i= 1, 2, \ldots, N$) of fan-outs, so that the number N of stages is minimum and the number of said dummy functional blocks is minimum.

9. A method as set forth in claim 7, wherein said function block number determining step determines the number of said functional blocks of each of said classes in accordance with a multiple of $M_i$ when the i-stage of said clock tree is calculated.

10. An apparatus for arranging a tree-type clock signal distributing circuit in a synchronous integrated circuit including a plurality of functional blocks, said apparatus including a processor, said apparatus comprising:

partitioning means for dividing said synchronous integrated circuit into a plurality of segments;

first calculating means for calculating a density of said functional blocks within each of said segments;

second calculating means for calculating a minimum value of the densities of said functional blocks;

quantizing means for quantizing the densities of functional blocks of said segments in accordance with the minimum value, so that said segments are divided into classes whose number is the same as a quantized density of each of said segments;

first allocating means for allocating said functional blocks within each of said segments to said classes thereof, so that a distribution of said functional blocks allocated to each of said classes is homogeneous within one of said segments to which the same class belong;

second allocating means for allocating one clock buffer to a substantial center position of said functional blocks allocated to each of said classes, to connect said clock buffer to said functional blocks within each of said classes; and repeating means for replacing said functional blocks with said clock buffers, until the number of clock buffers is one.

11. An apparatus as set forth in claim 10, wherein the partitioning means, first calculating means, second calculating means, quantizing means, determining means, first allocating means, second allocating means, and repeating means are all performed by said processor.

* * * * *